(12) United States Patent
Kiyama et al.

(10) Patent No.: US 8,969,920 B2
(45) Date of Patent: Mar. 3, 2015

(54) VERTICAL GAN-BASED SEMICONDUCTOR DEVICE

(75) Inventors: Makoto Kiyama, Itami (JP); Yu Saitoh, Itami (JP); Masaya Okada, Osaka (JP); Masaki Ueno, Itami (JP); Seiji Yaegashi, Yokohama (JP); Kazutaka Inoue, Yokohama (JP); Mitsunori Yokoyama, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 18 days.

(21) Appl. No.: 13/824,248

(22) PCT Filed: Jul. 6, 2011

(86) PCT No.: PCT/JP2011/065467
§ 371 (c)(1),
(2), (4) Date: Mar. 15, 2013

(87) PCT Pub. No.: WO2012/049892
PCT Pub. Date: Apr. 19, 2012

(65) Prior Publication Data
US 2013/0168739 A1 Jul. 4, 2013

(30) Foreign Application Priority Data
Oct. 13, 2010 (JP) .................. 2010-230770

(51) Int. Cl.
*H01L 29/66* (2006.01)
*H01L 29/778* (2006.01)
(Continued)

(52) U.S. Cl.
CPC ........ *H01L 29/778* (2013.01); *H01L 29/66462* (2013.01); *H01L 29/7788* (2013.01);
(Continued)

(58) Field of Classification Search
CPC .................................... H01L 29/778

USPC .......................................... 257/194
See application file for complete search history.

(56) References Cited

U.S. PATENT DOCUMENTS

| 4,567,641 A | 2/1986 | Baliga et al. | |
|---|---|---|---|
| 7,855,412 B2 * | 12/2010 | Matsuki et al. | ............... 257/330 |
| 2004/0157355 A1 * | 8/2004 | Kachi et al. | ..................... 438/46 |

FOREIGN PATENT DOCUMENTS

| JP | 58-202575 | 11/1983 |
|---|---|---|
| JP | 2002-050790 A | 2/2002 |

(Continued)

OTHER PUBLICATIONS

International Search Report in International Application No. PCT/JP2011/065467 dated Sep. 13, 2011.
(Continued)

*Primary Examiner* — Bilkis Jahan
(74) *Attorney, Agent, or Firm* — Venable LLP; Michael A. Sartori; F. Brock Riggs (57) ABSTRACT

A vertical semiconductor device in which pinch-off characteristics and breakdown voltage characteristics can be stably improved by fixing the electric potential of a p-type GaN barrier layer with certainty is provided. The semiconductor device includes a GaN-based stacked layer having an opening, a regrown layer including a channel located so as to cover a wall surface of the opening, an $n^+$-type source layer that is in ohmic contact with the source electrode, a p-type GaN barrier layer, and a $p^+$-type GaN-based supplementary layer located between the p-type GaN barrier layer and the $n^+$-type source layer. The $p^+$-type GaN-based supplementary layer and the $n^+$-type source layer form a tunnel junction to fix the electric potential of the p-type GaN barrier layer at a source potential.

8 Claims, 9 Drawing Sheets

(51) Int. Cl.
*H01L 29/20* (2006.01)
*H01L 29/423* (2006.01)

(52) U.S. Cl.
CPC ...... *H01L29/7789* (2013.01); *H01L 29/66431* (2013.01); *H01L 29/2003* (2013.01); *H01L 29/4236* (2013.01)
USPC .......................................... 257/194; 438/172

(56) References Cited

FOREIGN PATENT DOCUMENTS

| JP | 2002-533936 | 10/2002 |
| JP | 2003-505864 A | 2/2003 |
| JP | 2004-260140 | 9/2004 |
| JP | 2006-286942 | 10/2006 |
| JP | 2006-313773 A | 11/2006 |
| JP | 2008-192701 | 8/2008 |
| JP | 2009-283540 | 12/2009 |

OTHER PUBLICATIONS

Notification of Reasons for Rejection issued in Japanese Patent Application No. 2010-230770 dated Aug. 5, 2014.

* cited by examiner

VERTICAL GAN-BASED SEMICONDUCTOR DEVICE

TECHNICAL FIELD

The present invention relates to a semiconductor device used for high power switching and a method for producing the semiconductor device, and particularly to a semiconductor device that uses a GaN-based semiconductor among nitride-based semiconductors and a method for producing the semiconductor device.

BACKGROUND ART

High reverse breakdown voltage and low on-resistance are required for high current switching devices. Field effect transistors (FETs) that use a group III nitride-based semiconductor are excellent in terms of, for example, high breakdown voltage and high-temperature operation because of their wide band gap. Therefore, vertical transistors that use a GaN-based semiconductor have been particularly receiving attention as transistors for controlling high power. For example, PTL 1 and PTL 2 propose a vertical GaN-based FET whose mobility is increased and whose on-resistance is decreased by forming an opening in a GaN-based semiconductor and forming a regrown layer including a channel of two-dimensional electron gas (2DEG) on the wall surface of the opening. In this vertical GaN-based FET, a structure including a p-type GaN barrier layer is proposed in order to improve the pinch-off characteristics.

CITATION LIST

Patent Literature

PTL 1: Japanese Unexamined Patent Application Publication No. 2006-286942
PTL 2: Japanese Unexamined Patent Application Publication No. 2008-192701

SUMMARY OF INVENTION

Technical Problem

In the vertical GaN-based FET, the pinch-off characteristics and breakdown voltage characteristics may be improved using the p-type GaN barrier layer. However, the p-type impurity concentration cannot be sufficiently increased because, for example, the p-type GaN barrier layer is located near a channel. The pinch-off characteristics and breakdown voltage characteristics can be improved only when some conditions are satisfied. Thus, it is difficult to stably improve the pinch-off characteristics and breakdown voltage characteristics with certainty.

It is an object of the present invention to provide a vertical GaN-based semiconductor device in which pinch-off characteristics and breakdown voltage characteristics can be stably improved by fixing the electric potential of a p-type GaN barrier layer with certainty and a method for producing the semiconductor device.

Solution to Problem

A semiconductor device of the present invention is a vertical semiconductor device including a GaN-based stacked layer having an opening. The semiconductor device includes a regrown layer including a channel located so as to cover a wall surface of the opening; a p-type GaN-based semiconductor layer having an end face covered with the regrown layer at the wall surface of the opening; an n$^+$-type GaN-based semiconductor layer serving as a top layer of the GaN-based stacked layer; a p$^+$-type GaN-based supplementary layer containing a p-type impurity in a concentration higher than that of the p-type GaN-based semiconductor layer, the p$^+$-type GaN-based supplementary layer being located between the p-type GaN-based semiconductor layer and the n$^+$-type GaN-based semiconductor layer; a gate electrode located on the regrown layer in the opening; and a source electrode located on the GaN-based stacked layer around the opening so as to be in contact with the regrown layer and the n$^+$-type GaN-based semiconductor layer. The regrown layer includes an electron drift layer and an electron source layer and the channel is formed of two-dimensional electron gas generated in the electron drift layer at a position near an interface between the electron drift layer and the electron source layer. The p$^+$-type GaN-based supplementary layer is included in an electric connection structure that electrically connects the p-type GaN-based semiconductor layer and the source electrode to each other in order to fix an electric potential of the p-type GaN-based semiconductor layer at an electric potential of the source electrode.

In the above structure, the p-type GaN-based semiconductor layer (hereinafter referred to as "p-type barrier layer") is expected to produce the following effects.

(a1) improvement in pinch-off characteristics due to the shift of a band in a positive direction
(a2) improvement in breakdown voltage characteristics However, the p-type impurity concentration in the p-type barrier layer cannot be sufficiently increased due to the following reasons.
(b1) The p-type barrier layer faces a channel and mixing with a p-type impurity degrades the channel characteristics. That is, if a p-type impurity is mixed in the electron drift layer/electron source layer, the on-resistance is highly likely to increase.
(b2) The p-type barrier layer forms a pn junction with an n$^-$-type GaN-based drift layer located directly below the p-type barrier layer and good reverse I (current)-V (voltage) characteristics (breakdown voltage characteristics) are achieved during channel off. However, a high p-type impurity concentration degrades the reverse voltage characteristics.

The p-type impurity concentration cannot be sufficiently increased due to the above reasons (b1) and (b2). Therefore, even if the source electrode is extended so as to be in contact with the p-type barrier layer, the electric potential of the p-type barrier layer is not always fixed and the effects (a1) and (a2) cannot always be produced.

In the present invention, the p$^+$-type GaN-based supplementary layer is disposed between the p-type barrier layer and the n$^+$-type GaN-based semiconductor layer (hereinafter referred to as "n$^+$-type source layer"). The p$^+$-type GaN-based supplementary layer is incorporated in an electric connection structure that electrically connects the p-type barrier layer and the source electrode to each other. Therefore, the electric potential of the p-type barrier layer is stably fixed at an electric potential of the source electrode with a low contact resistance with certainty. As a result, the above effects (a1) and (a2) can be produced with certainty. In particular, in relation to (a2) or (b2), holes generated under the application of reverse bias voltage at the pn junction can be absorbed through the electric connection structure. This prevents the degradation of breakdown voltage characteristics caused when holes are left, which can stably produce good breakdown voltage characteristics.

The p-type barrier layer may be a p-type GaN layer or a p-type AlGaN layer. When the p-type AlGaN layer is employed, a band can be further shifted in a positive direction and the pinch-off characteristics can be further improved. Regarding other layers constituting the GaN-based stacked layer, other GaN-based semiconductor layers may be used instead of the GaN layers, if necessary.

The GaN-based stacked layer is obtained by performing epitaxial growth on a predetermined crystal face of GaN. The GaN base may be a GaN substrate or a GaN film on a support substrate. Alternatively, by forming a GaN layer on a GaN substrate or the like during the growth of a GaN-based stacked layer and then removing a portion having a certain thickness corresponding to the thickness of the GaN substrate or the like, only a thin GaN layer may be left as a base in the form of products. The thin GaN layer left as a base may be a conductive or nonconductive layer. A drain electrode can be disposed on the top or bottom surface of the thin GaN layer depending on the production process and the structure of products.

In the case where the GaN substrate, the support substrate, or the like is left in a product, the support substrate or the substrate may be a conductive or nonconductive substrate. When the support substrate or the substrate is a conductive substrate, the drain electrode can be disposed directly on the bottom (lower) surface or top (upper) surface of the support substrate or the substrate. When the support substrate or the substrate is a nonconductive substrate, the drain electrode can be disposed above the nonconductive substrate and on a conductive layer located on the lower layer side in the semiconductor layers.

The $n^+$-type source layer and the $p^+$-type GaN-based supplementary layer may form a tunnel junction, and the source electrode and the p-type barrier layer may be electrically connected to each other through the tunnel junction.

In the above structure, since the $n^+$-type source layer serving as a top layer of the GaN-based stacked layer is in ohmic contact with the source electrode, the $n^+$-type source layer is formed as an $n^+$-type GaN-based semiconductor layer originally having high donor concentration. By maintaining or further increasing the high donor concentration, a tunnel junction can be formed in the $n^+$-type source layer/$p^+$-type GaN-based supplementary layer. This tunnel junction corresponds to the above-described electric connection structure.

Another tunnel junction can be formed in the above semiconductor device by employing a structure in which only the donor concentration near an interface of the junction is further increased.

In the tunnel junction formed by the $n^+$-type source layer/$p^+$-type GaN-based supplementary layer, the Fermi level is present in a conduction band in the $n^+$-type source layer and in a valence band in the $p^+$-type GaN-based supplementary layer. The depletion layer becomes extremely narrow, and the conduction band minimum of the $n^+$-type source layer and the valence band maximum of the $p^+$-type GaN-based supplementary layer are located at the same energy level. In this state, if a change in electric potential occurs on one side, for example, electrons in the conduction band of the $n^+$-type source layer pass through a forbidden band due to a tunnel effect and directly move into the valence band of the $p^+$-type GaN-based supplementary layer, rather than crossing a high potential barrier. In the case of a change in electric potential in the reverse direction, electrons at the valence band maximum of the $p^+$-type GaN-based supplementary layer pass through the depletion layer due to a tunnel effect and move into the conduction band of the $n^+$-type source layer. That is, there seems to be no potential barrier between the $n^+$-type source layer and the $p^+$-type GaN-based supplementary layer, the structure is electrically flat, and there is an electrical connection between the $n^+$-type GaN source layer and the $p^+$-type GaN supplementary layer.

Therefore, the electric potential of the p-type barrier layer is fixed at a source potential with an extremely low contact resistance, which can stably produce the above effects (a1) and (a2) with certainty. According to a picture of the band structure of the tunnel junction, in relation to (a2) and (b2), the absorption or annihilation of holes can occur and the decrease in breakdown voltage caused when holes are left can be prevented.

Furthermore, in this tunnel junction, there is no need to additionally dispose an extended electrode or the like. Thus, a simple structure is provided and the production process is also simplified.

The $p^+$-type GaN-based supplementary layer may have a p-type impurity concentration of $5 \times 10^{18}$ cm$^{-3}$ or more and $5 \times 10^{20}$ cm$^{-3}$ or less and the $n^+$-type GaN-based semiconductor layer may have a donor concentration of $1 \times 10^{18}$ cm$^{-3}$ or more and $5 \times 10^{20}$ cm$^{-3}$ or less.

In the above structure, a tunnel junction can be easily formed and the electric potential of the p-type barrier layer can be fixed at a source potential with certainty.

Another electric connection structure may include the source electrode and an extended electrode conductively connected to the $p^+$-type GaN-based supplementary layer. By electrically connecting the extended electrode to the source electrode, the source electrode and the p-type barrier layer can be electrically connected to each other.

Thus, the electric potential of the p-type barrier layer can be fixed at a source potential (ground potential) with certainty. The extended electrode/$p^+$-type GaN-based supplementary layer corresponds to the electric connection structure.

The source electrode may extend so as to also serve as the extended electrode.

Thus, the structure of the semiconductor device and the production process can be simplified.

The thickness of the $p^+$-type GaN-based supplementary layer may be one fifth or less the thickness of the p-type barrier layer.

Thus, even if the p-type impurity concentration is increased, the adverse effects on the channel can be avoided. The adverse effects on reverse I-V characteristics (breakdown voltage characteristics) can also be avoided.

The $p^+$-type GaN-based supplementary layer may have a thickness of 5 nm or more and 100 nm or less.

When the thickness is 100 nm or less, good electrical connection (tunnel junction with low resistance or low contact resistance) can be achieved. If the thickness is less than 5 nm, it is difficult to uniformly form a thin film. A thin film with some holes is formed because of lack of film growth and thus an appropriate thin film cannot be formed in a stable manner.

The $p^+$-type GaN-based supplementary layer may be disposed away from the wall surface of the opening.

As in the p-type barrier layer, the $p^+$-type GaN-based supplementary layer does not necessarily cover the entire region other than the opening. By disposing the $p^+$-type GaN-based supplementary layer away from the opening, the adverse effects of a p-type impurity on the channel can be avoided.

An insulating layer may be formed on the regrown layer and below the gate electrode.

By disposing an insulating layer below the gate electrode, a gate leak current generated when positive voltage is applied to the gate electrode can be suppressed, which allows high-current operation. Since the threshold voltage can be further shifted in a positive direction, normally-off is easily achieved.

In a method for producing a semiconductor device according to the present invention, a vertical GaN-based semiconductor device is produced. The production method includes a step of forming a p-type barrier layer on an n⁻-type GaN-based drift layer; a step of forming a p⁺-type GaN-based supplementary layer on the p-type barrier layer; a step of forming an n⁺-type source layer on the p⁺-type GaN-based supplementary layer; a step of forming, by etching, an opening that extends from a top layer to the n⁻-type GaN-based semiconductor layer; a step of epitaxially growing a regrown layer in the opening, the regrown layer including an electron drift layer and an electron source layer; and a step of forming a source electrode around the opening so as to be in contact with the regrown layer and the n⁺-type GaN-based semiconductor layer. The donor concentration of the n⁺-type source layer is set to be $1\times10^{18}$ cm$^{-3}$ or more and $5\times10^{20}$ cm$^{-3}$ or less and the p-type impurity concentration of the p⁺-type GaN-based supplementary layer is set to be $5\times10^{18}$ cm$^{-3}$ or more and $5\times10^{20}$ cm$^{-3}$ or less so that the n⁺-type source layer and the p⁺-type GaN-based supplementary layer form a tunnel junction.

According to the above method, the electric potential of the p-type barrier layer can be fixed at a source potential by using a simple electric connection structure, which can produce the above effects (a1) and (a2). In particular, holes generated at the pn junction between the p-type barrier layer and the n⁻-type drift layer disposed directly below the p-type barrier layer can be absorbed or annihilated through the tunnel junction. As a result, the decrease in breakdown voltage caused when holes are left is prevented and the breakdown voltage characteristics can be stably ensured all the time.

In another method for producing a semiconductor device of the present invention, a vertical GaN-based semiconductor device including a source electrode on one principal surface and a drain electrode on the other principal surface is produced. The production method includes a step of forming a p-type barrier layer on an n⁻-type GaN-based drift layer; a step of forming a p⁺-type GaN-based supplementary layer on the p-type barrier layer; a step of forming an n⁺-type source layer on the p⁺-type GaN-based supplementary layer; a step of forming, by etching, an opening that extends from a top layer to the n⁻-type GaN-based drift layer; a step of epitaxially growing a regrown layer in the opening, the regrown layer including an electron drift layer and an electron source layer; a step of exposing the p⁺-type GaN-based supplementary layer by selectively removing the n⁺-type source layer using photolithography and then forming an extended electrode by performing filling with a conductive material; and a step of forming a source electrode so as to be in contact with the extended electrode, the n⁺-type source layer, and the regrown layer.

According to the above method, the electric potential of the p-type barrier layer can be fixed at a source potential by using an electric connection structure with a simple principle, which can produce the above effects (a1) and (a2). Furthermore, holes generated at the pn junction between the p-type barrier layer and the n⁻-type drift layer disposed directly below the p-type barrier layer can be absorbed or annihilated through the tunnel junction. As a result, the degradation of breakdown voltage characteristics caused when holes are left can be prevented.

In the step of forming the extended electrode and the step of forming the source electrode, for the purpose of allowing the source electrode to also serve as the extended electrode, in the photolithography, the n⁺-type source layer and the regrown layer may be selectively removed to expose the p⁺-type GaN-based supplementary layer and then the source electrode may be formed by performing filling with a conductive material so that the source electrode is in contact with the p⁺-type GaN-based supplementary layer, the n⁺-type source layer, and the regrown layer.

Thus, the source electrode that also serves as the extended electrode is simply formed while some production processes are omitted. The thus-produced semiconductor device has substantially the same performance as that of the semiconductor device in which the extended electrode is separately disposed.

In the step of forming the p⁺-type GaN-based supplementary layer on the p-type barrier layer, the p⁺-type GaN-based supplementary layer may be formed away from the opening by implanting a p-type impurity by ion implantation in a region of the p-type barrier layer, the region being present at a certain distance from a region constituted by the opening.

By partially disposing the p⁺-type GaN-based supplementary layer by this method, the pinch-off characteristics and breakdown voltage characteristics can be improved using the p-type barrier layer without exerting the adverse effects of the p-type impurity on the channel.

In the step of forming the p⁺-type GaN-based supplementary layer on the p-type barrier layer, the p⁺-type GaN-based supplementary layer may be selectively grown in a region of the p-type barrier layer, the region being present at a certain distance from a region constituted by the opening.

As in the method described above, the pinch-off characteristics and breakdown voltage characteristics can be improved using the p-type barrier layer without exerting the adverse effects of the p-type impurity on the channel. The p⁺-type GaN-based supplementary layer is thin, and thus the n⁺-type source layer may be then grown by a typical method to flatten the surface.

Advantageous Effects of Invention

According to the semiconductor device of the present invention, in a vertical GaN-based semiconductor device, the electric potential of the p-type barrier layer can be fixed at a source potential with certainty and thus the pinch-off characteristics and breakdown voltage characteristics can be stably improved.

DESCRIPTION OF EMBODIMENTS (First Embodiment)

Figure 1:
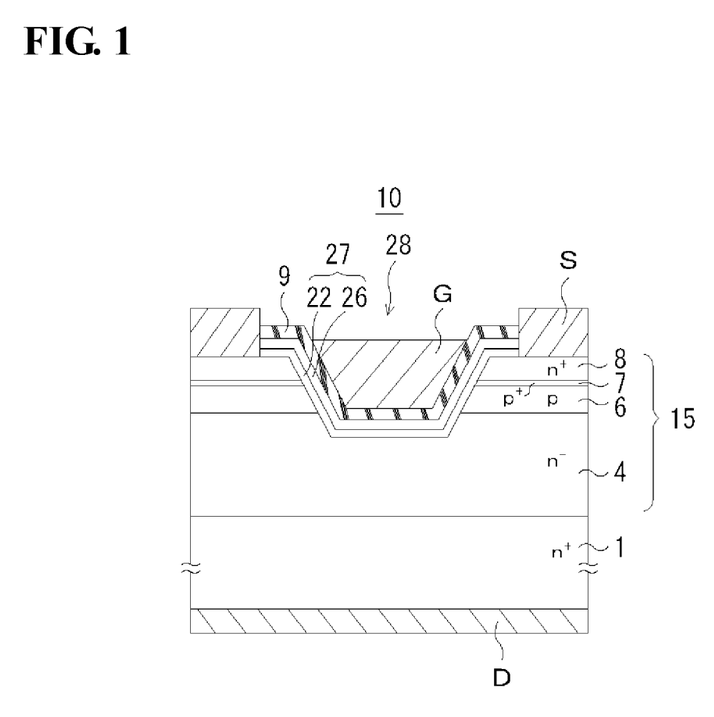
FIG. 1 shows a vertical GaN-based FET (semiconductor device) according to a first embodiment of the present invention and is a sectional view taken along line I-I of a plan view shown in FIG. 2.
Figure 2:
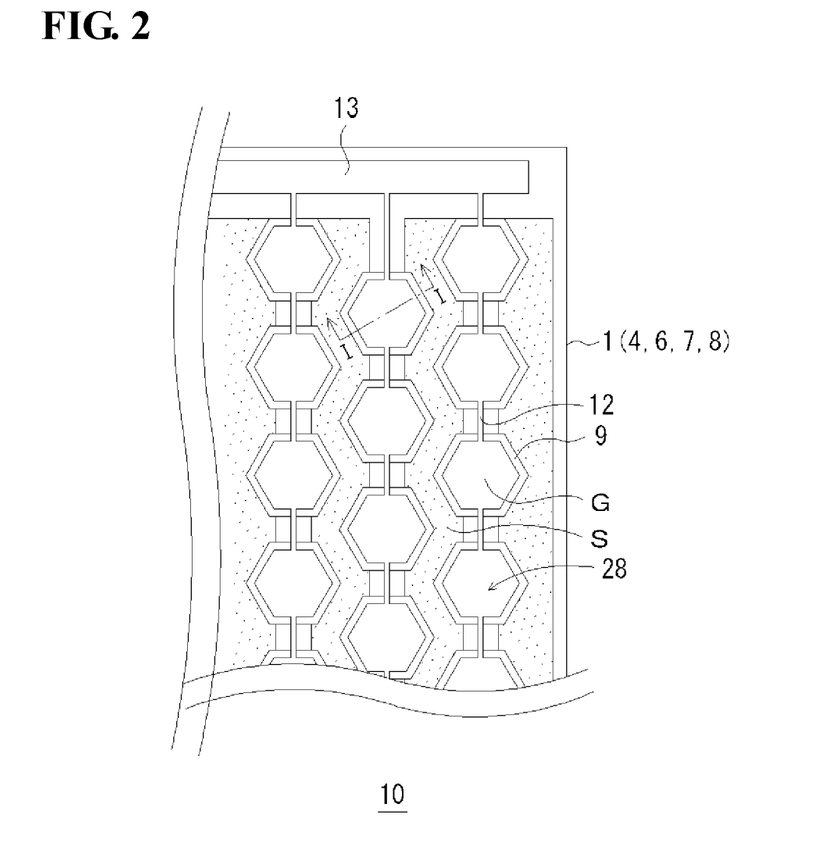
FIG. 2 is a plan view of the vertical GaN-based FET in FIG. 1.

FIG. 1 is a sectional view of a vertical GaN-based FET (semiconductor device) 10 according to a first embodiment of the present invention. FIG. 2 is a plan view and FIG. 1 is a sectional view taken along line I-I of FIG. 2. The vertical GaN-based FET 10 includes a conductive GaN substrate 1 and n$^-$-type GaN drift layer 4/p-type GaN barrier layer 6/p$^+$-type GaN supplementary layer 7/n$^+$-type GaN source layer 8 epitaxially grown on the GaN substrate 1. The p$^+$-type GaN supplementary layer 7 is a layer disposed to fix the electric potential of the p-type GaN barrier layer 6 and is included in an electric connection structure for fixing the electric potential at a source potential.

The n$^-$-type GaN drift layer 4/p-type GaN barrier layer 6/p$^+$-type GaN supplementary layer 7/n$^+$-type GaN source layer 8 is successively formed to constitute a GaN-based stacked layer 15. A buffer layer composed of an AlGaN layer or GaN layer may be inserted between the GaN substrate 1 and the n$^-$-type GaN drift layer 4 depending on the type of the GaN substrate 1.

The GaN substrate 1 may be a substrate including a GaN layer that is in ohmic contact with a support substrate. Alternatively, as described above, by removing a portion having a thickness corresponding to the thickness of a GaN substrate or the like, only a thin GaN layer may be left as a base film for the epitaxial growth of a GaN-based stacked layer in the form of products. The GaN substrate, the substrate including a GaN layer that is in ohmic contact with a support substrate, the thin GaN layer left as a base in the form of products, and the like may be simply referred to as a GaN substrate.

In this embodiment, the p-type GaN barrier layer 6 is used as the p-type GaN barrier layer, but a p-type AlGaN layer may be used. Regarding other layers constituting the GaN-based stacked layer 15, other GaN-based semiconductor layers may be used instead of the GaN layers, if necessary.

In the GaN-based stacked layer 15, an opening 28 is formed so as to penetrate from the n$^+$-type GaN source layer 8 to the p-type GaN barrier layer 6 and reach the n$^-$-type GaN drift layer 4. A regrown layer 27 is formed by epitaxial growth so as to cover the wall surface of the opening 28 and the top layer (n$^+$-type GaN source layer 8) of the GaN-based stacked layer 15. The regrown layer 27 is constituted by an intrinsic GaN (i-type GaN) electron drift layer 22 and an AlGaN electron source layer 26. An intermediate layer composed of AlN or the like may be inserted between the i-type GaN electron drift layer 22 and the AlGaN electron source layer 26. A gate electrode G is located above the regrown layer 27 with an insulating layer 9 disposed therebetween. A drain electrode D is located on the bottom surface of the GaN substrate 1. A source electrode S is located on the GaN-based stacked layer 15 so as to be in ohmic contact with the regrown layer 27 and the n$^+$-type GaN source layer 8. In FIG. 1, the source electrode S is located on the n$^+$-type GaN source layer 8 so as to be in contact with the end face of the regrown layer 27.

In the semiconductor device according to this embodiment, electrons flow from the source electrode S and (P1) enter the electron drift layer 22 directly or (P2) enter the electron drift layer 22 via the n$^+$-type GaN source layer 8. After electrons pass through the path (P1) or (P2), two-dimensional electron gas is formed in the electron drift layer 22 at a position near the interface between the electron drift layer 22 and the electron source layer. The electrons flow in a thickness direction or a vertical direction from the electron drift layer 22 to the drain electrode D through the n$^-$-type GaN drift layer 4. In this path of electrons, the p-type GaN barrier layer 6 is sandwiched between the n$^-$-type GaN drift layer 4 and the n$^+$-type GaN source layer 8. The p-type GaN barrier layer 6 raises the band energy of electrons and is expected to produce a backgate effect which, for example, improves breakdown voltage characteristics. In other words, the p-type GaN barrier layer 6 is expected to produce the following effects (a1) and (a2).

(a1) improvement in pinch-off characteristics due to the shift of a band in a positive direction (a2) improvement in breakdown voltage characteristics However, the acceptor concentration in the p-type GaN barrier layer 6 cannot be sufficiently increased due to the following reasons.

(b1) A high acceptor concentration may adversely affect the channel characteristics, in particular, the on-resistance because the p-type GaN barrier layer 6 faces the channel.

(b2) A high acceptor concentration may impair good reverse current-voltage characteristics (breakdown voltage characteristics) at a pn junction between the p-type GaN barrier layer 6 and the n$^-$-type GaN drift layer.

In a structure not including the p$^+$-type GaN supplementary layer 7, if the acceptor concentration of the p-type GaN barrier layer 6 cannot be sufficiently increased, the electric potential of the p-type GaN barrier layer is not fixed and thus the above effects (a1) and (a2) cannot be stably produced. In the vertical GaN-based FET 10, an extremely high voltage of about 1 kV is applied between the source electrode S and the drain electrode D. Therefore, it is difficult to achieve the practical use of the device unless the above effects are stably produced all the time.

In this embodiment, a p$^+$-type GaN supplementary layer 7 is disposed between the p-type GaN barrier layer 6 and the n$^+$-type GaN source layer 8. The n$^+$-type GaN source layer 8 and the p$^+$-type GaN supplementary layer 7 form a tunnel junction between the source electrode S and the p-type GaN barrier layer 6.

In the tunnel junction formed by the n$^+$-type GaN source layer 8/p$^+$-type GaN supplementary layer 7, the Fermi level is present in a conduction band in the n$^+$-type GaN source layer 8 and in a valence band in the p$^+$-type GaN supplementary layer 7. The depletion layer becomes extremely narrow, and the conduction band minimum of the n$^+$-type GaN source layer 8 and the valence band maximum of the p$^+$-type GaN supplementary layer 7 are located at the same energy level. In this state, if a change in electric potential occurs on one side, for example, electrons in the conduction band of the n$^+$-type GaN source layer 8 pass through a forbidden band due to a tunnel effect and directly move into the valence band of the p$^+$-type GaN supplementary layer 7, rather than crossing a high potential barrier. In the case of a change in electric potential in the reverse direction, electrons at the valence band maximum of the p$^+$-type GaN supplementary layer 7 pass through the depletion layer due to a tunnel effect and move into the conduction band of the n$^+$-type GaN source layer 8. That is, there seems to be no potential barrier between the n$^+$-type GaN source layer 8 and the p$^+$-type GaN supplementary layer 7 and there is an electrical connection between the n$^+$-type GaN source layer 8 and the p$^+$-type GaN supplementary layer 7.

Therefore, the electric potential of the p-type barrier layer is fixed at a source potential with an extremely low contact resistance, which can stably produce the above effects (a1) and (a2) with certainty. According to a picture of the band structure of the tunnel junction, in relation to (a2) and (b2), the absorption or annihilation of holes can occur and the degradation of breakdown voltage characteristics caused when holes are left is prevented. As a result, good breakdown voltage characteristics can be stably produced for a long time.

Furthermore, in this tunnel junction, there is no need to additionally dispose an extended electrode or the like. Thus, a simple structure is provided and the production process is also simplified.

The p-type impurity concentration of the p-type GaN barrier layer 6 may normally be about $1 \times 10^{17}$ cm$^{-3}$ to $1 \times 10^{19}$ cm$^{-3}$. The p-type impurity may be an impurity, such as Mg, that forms an acceptor in a GaN-based semiconductor. The thickness of the p-type GaN barrier layer 6 is dependent on, for example, the thickness of the n$^-$-type GaN drift layer, and thus the range of the thickness cannot be determined in a general manner. However, the typical thickness often used in many devices in consideration of the above effects (a1) and (a2) is 0.5 µm. If the thickness is less than 0.5 µm, the effects (a1) and (a2) cannot be sufficiently produced and thus 0.5 µm may be set as the lower limit of the thickness. If the p-type GaN barrier layer 6 having a thickness of about 0.5 µm has an excessively high Mg content, the channel is adversely affected. The reverse voltage characteristics (breakdown voltage characteristics) at a pn junction between the p-type GaN barrier layer 6 and the n$^-$-type GaN drift layer during channel off are also degraded. The thickness of the p$^+$-type GaN supplementary layer 7 may be one fifth or less the thickness of the p-type GaN barrier layer 6.

The acceptor concentration such as Mg concentration may be $5 \times 10^{18}$ cm$^{-3}$ to $5 \times 10^{20}$ cm$^{-3}$. The absolute value of the thickness of the p$^+$-type GaN supplementary layer 7 may be 5 nm or more and 100 nm or less.

The donor concentration of the n$^+$-type GaN source layer 8 may be $1 \times 10^{18}$ cm$^{-3}$ or more and $5 \times 10^{20}$ cm$^{-3}$ or less. Thus, a tunnel junction can be formed by the p$^+$-type GaN supplementary layer 7 and the n$^+$-type GaN source layer 8. The thickness of the n$^+$-type GaN source layer 8 may be about 0.2 µm to 0.6 µm.

The n$^-$-type GaN drift layer 4 may have, for example, a thickness of about 4 µm and a carrier concentration of about $1 \times 10^{16}$ cm$^{-3}$.

Referring to FIG. 2, the opening 28 and the gate electrode G have a hexagonal shape and a region around the gate electrode G is substantially covered with the source electrode S while the source electrode S does not overlap a gate wiring line 12. Consequently, a closest-packed structure (honeycomb structure) is formed and thus the gate electrode has a long perimeter per unit area, which can decrease the on-resistance. An electric current flows from the source electrode S and enters a channel (electron drift layer 22) in the regrown layer 27 (P1) directly or (P2) through the n$^+$-type GaN source layer 8. Then, the electric current flows to the drain electrode D through the n$^-$-type GaN drift layer 4. In order to prevent the source electrode S and the wiring line thereof from interfering with a gate structure including the gate electrode G, the gate wiring line 12, and a gate pad 13, the source wiring line is disposed on an interlayer-insulating layer (not shown). A via hole is formed in the interlayer-insulating layer, and the source electrode S including a conductive portion obtained by filling the via hole is conductively connected to a source conductive layer (not shown) on the interlayer-insulating layer. As a result, a source structure including the source electrode S can have low electrical resistance and high mobility, which are suitable for high-power devices.

The perimeter of the opening per unit area can also be increased by densely arranging elongated openings instead of employing the hexagonal honey-comb structure. Consequently, the current density can be increased.

Figure 3:
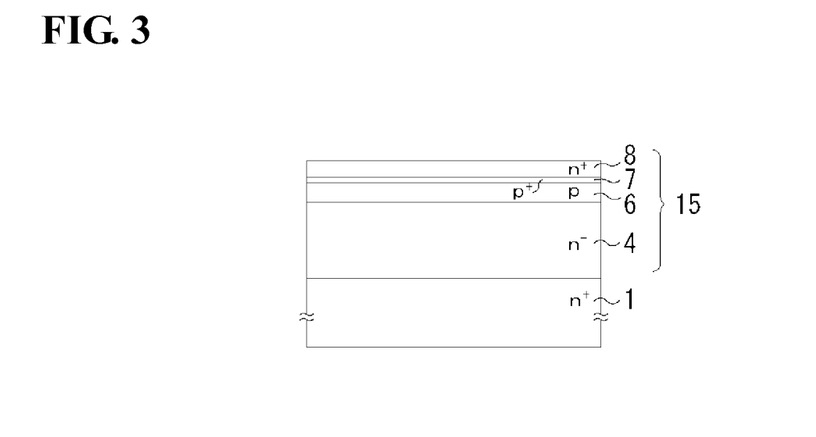
FIG. 3 is a diagram showing a method for producing the vertical GaN-based FET in FIG. 1, the diagram showing the state in which an epitaxial stacked layer including layers up to a source layer has been formed on a substrate including a GaN layer that is in ohmic contact with a support substrate.

A method for producing the semiconductor device 10 according to this embodiment will be described. As shown in FIG. 3, a GaN-based stacked layer 15 including n$^-$-type GaN drift layer 4/p-type GaN barrier layer 6/p$^+$-type GaN supplementary layer 7/n$^+$-type GaN source layer 8 is epitaxially grown on a GaN substrate 1 corresponding to the above-described GaN substrate. A GaN-based buffer layer (not shown) may be inserted between the GaN substrate 1 and the n$^-$-type GaN drift layer 4.

The formation of the above layers may be performed by, for example, metal-organic chemical vapor deposition (MOCVD). By performing growth using MOCVD, a GaN-based stacked layer 15 having good crystallinity can be formed. In the case where the GaN substrate 1 is formed by growing a gallium nitride film on a conductive substrate using MOCVD, trimethylgallium is used as a gallium raw material. High-purity ammonia is used as a nitrogen raw material. Purified hydrogen is used as a carrier gas. The purity of the high-purity ammonia is 99.999% or more and the purity of the purified hydrogen is 99.999995% or more. A hydrogen-based silane may be used as a Si raw material for an n-type dopant (donor) and cyclopentadienyl magnesium may be used as a Mg raw material for a p-type dopant (acceptor).

A conductive gallium nitride substrate having a diameter of two inches is used as the conductive substrate. The substrate is cleaned at 1030° C. at 100 Torr in an atmosphere of ammonia and hydrogen.

Subsequently, the temperature is increased to 1050° C. and a gallium nitride layer is grown at 200 Torr at a V/III ratio of 1500.

By employing the above-described method, the n⁻-type GaN drift layer 4/p-type GaN barrier layer 6/p⁺-type GaN supplementary layer 7/n⁺-type GaN source layer 8 is grown on the GaN substrate 1 in that order.

Figure 4:
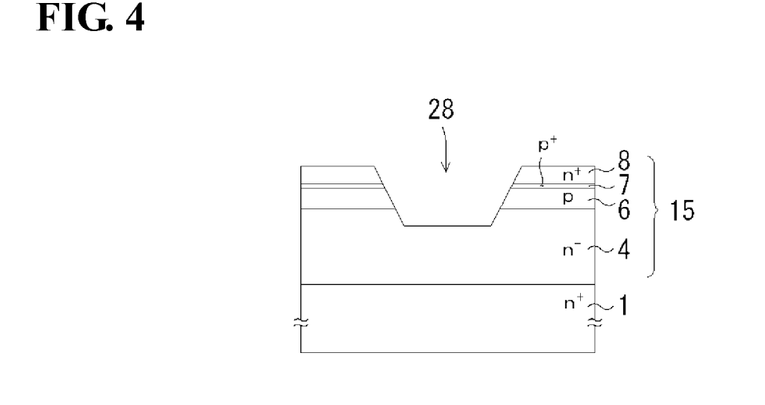
FIG. 4 is a diagram showing the state in which an opening has been formed by etching.
Figure 5A:
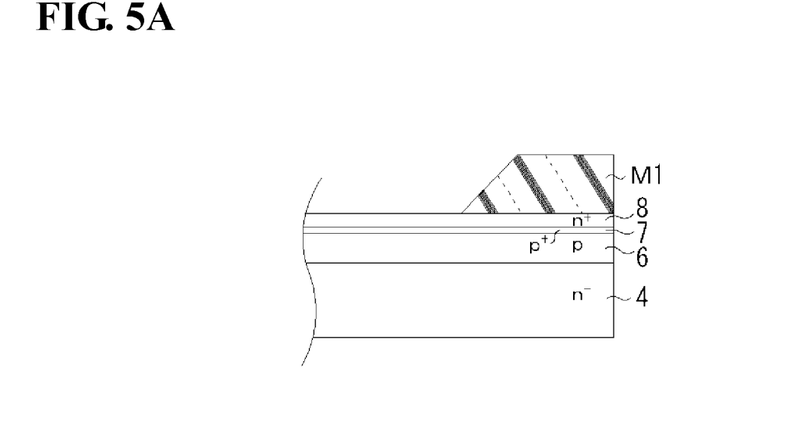
FIG. 5A is a diagram showing the state in which, at the stage of forming an opening by RIE, a resist pattern has been formed.
Figure 5B:
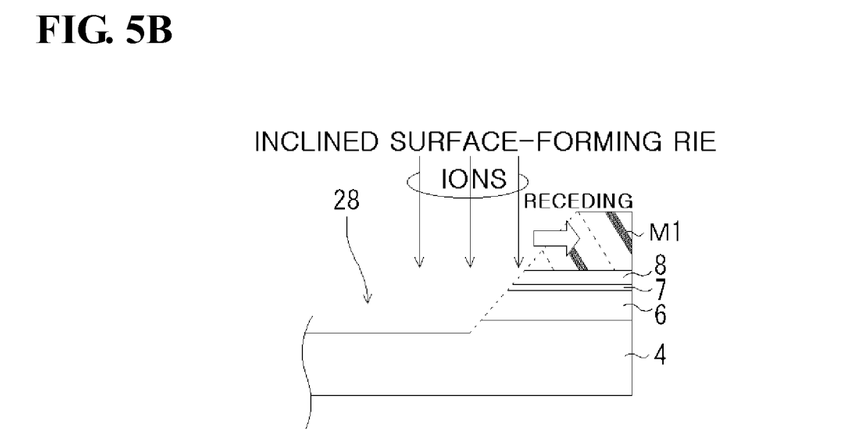
FIG. 5B is a diagram showing the state in which, at the stage of forming an opening by RIE, the stacked layer is etched down by performing ion irradiation and an opening is expanded (caused to recede).

Subsequently, as shown in FIG. 4, an opening 28 is formed by reactive ion etching (RIE). As shown in FIGS. 5A and 5B, a resist pattern M1 is formed on the top of epitaxial layers 4, 6, 7, and 8. The resist pattern M1 is then etched by RIE to cause the resist pattern M1 to recede, whereby an opening is expanded to form an opening 28. In this RIE process, the inclined surface of the opening 28, that is, the end face of the GaN-based stacked layer 15 is damaged by being subjected to ion irradiation. In the damaged portion, for example, a high-density region of dangling bonds and lattice defects is formed. Conductive impurities derived from an RIE device or unspecified sources reach the damaged portion and thus enrichment occurs. The formation of the damaged portion results in an increase in drain leak current and thus the restoration needs to be performed. When hydrogen and ammonia are contained at certain levels, the restoration regarding the dangling bonds and the like and the removal and passivation of the impurities can be achieved during the growth of a regrown layer 27 described below.

Figure 6:
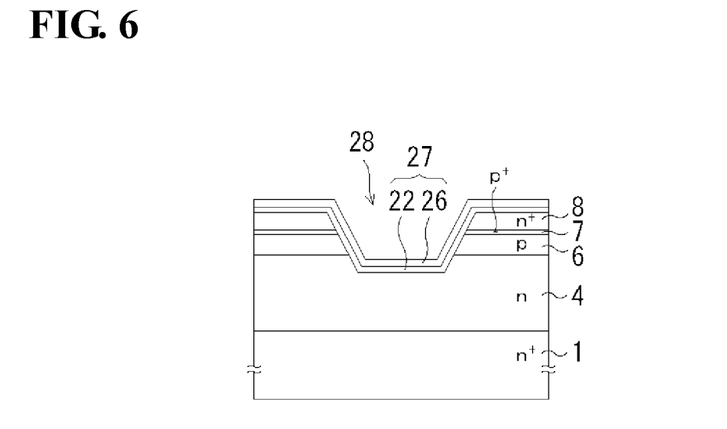
FIG. 6 is a diagram showing the state in which a regrown layer has been formed in the opening.

Subsequently, the resist pattern M1 is removed and the wafer is cleaned. The wafer is inserted into an MOCVD apparatus and a regrown layer 27 including an electron drift layer 22 composed of undoped GaN and an electron source layer 26 composed of undoped AlGaN is grown as shown in FIG. 6. In the growth of the undoped GaN layer 22 and undoped AlGaN layer 26, thermal cleaning is performed in an atmosphere of ($NH_3+H_2$), and then an organic metal material is supplied while ($NH_3+H_2$) is being introduced. In the thermal cleaning before the formation of the regrown layer 27 or in the formation of the regrown layer 27, the restoration regarding the damaged portion and the removal and passivation of the conductive impurities are allowed to proceed.

Figure 7:
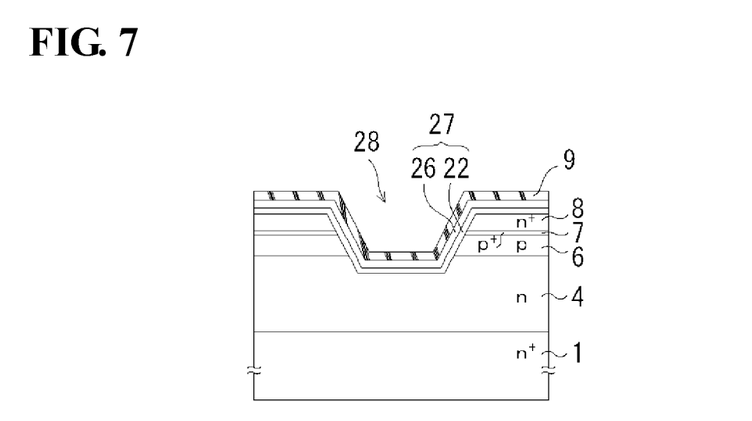
FIG. 7 is a diagram showing the state in which an insulating layer has been grown on the regrown layer.

Subsequently, the wafer is taken out of the MOCVD apparatus. An insulating layer 9 is grown as shown in FIG. 7. A source electrode S and a drain electrode D are formed on the top surface of the epitaxial layer and the bottom surface of the GaN substrate 1, respectively, by photolithography and electron beam deposition as shown in FIG. 1. Furthermore, a gate electrode G is formed on the side surface of the opening 28.

<Modification of Semiconductor Device in FIG. 1>

Figure 8:
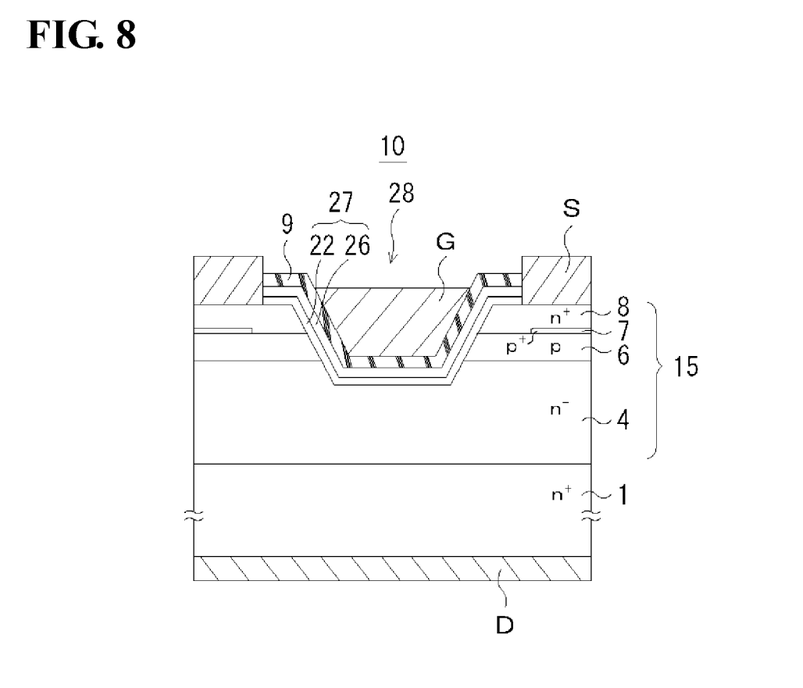
FIG. 8 is a sectional view of a semiconductor device that belongs to the first embodiment of the present invention, which is a modification of the semiconductor device in FIG. 1.

FIG. 8 is a diagram showing another semiconductor device 10 according to the first embodiment of the present invention, which is a modification of the semiconductor device in FIG. 1. In the semiconductor device in FIG. 1, the p⁺-type GaN supplementary layer 7 is present in the entire region other than the opening 28. However, in the modification shown in FIG. 8, the p⁺-type GaN supplementary layer 7 is disposed away from the opening 28. Even if the p⁺-type GaN supplementary layer 7 is partially disposed, the p⁺-type GaN supplementary layer 7 and the n⁺-type GaN source layer 8 can form a tunnel junction.

Consequently, as in the semiconductor device in FIG. 1, the electric potential of the p-type GaN barrier layer 6 is fixed at a ground potential with a low contact resistance, which can stably produce the above effects (a1) and (a2) all the time. The absorption or annihilation of holes generated from a depletion layer of the pn junction between the p-type GaN barrier layer 6 and the n⁻-type GaN drift layer 4 under the application of reverse bias can also be achieved.

Since the p⁺-type GaN supplementary layer 7 is disposed away from the opening 28, there is no possibility that an acceptor or a p-type impurity moves into the electron drift layer 22 and thus the advantages such as low on-resistance can be sufficiently utilized. A p-type impurity such as Mg moves relatively easily. In the semiconductor device shown in FIG. 1 in which the entirety of the p⁺-type GaN supplementary layer 7 is present, the p-type impurity enters the electron drift layer 22 and may hinder the movement of electrons, though the probability of this happening is low compared with the case where the p-type impurity concentration of the p-type GaN barrier layer 6 is increased. In contrast, according to this modification, the movement of the p-type impurity into the electron drift layer 22 caused by the p⁺-type GaN supplementary layer 7 can be prevented with certainty.

(Second Embodiment)

Figure 9:
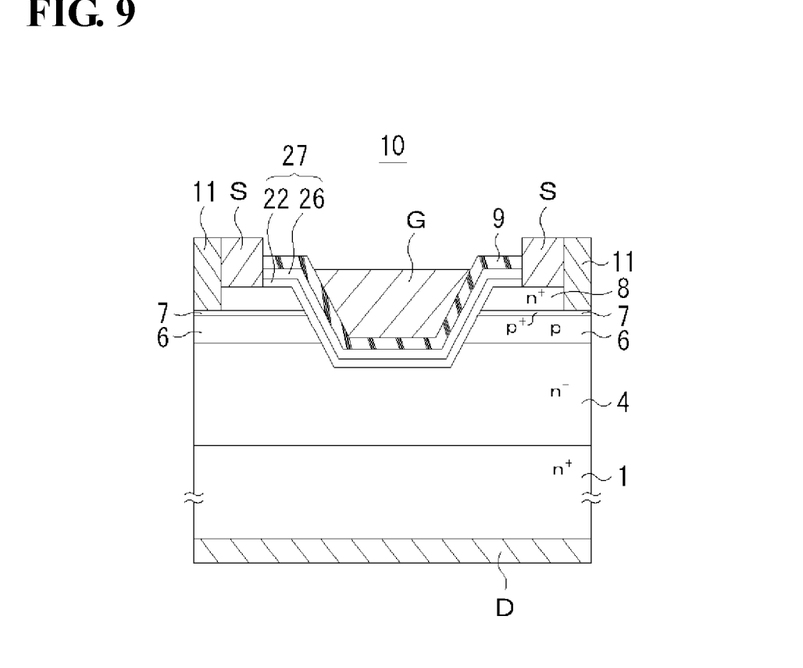
FIG. 9 is a sectional view showing a vertical GaN-based FET (semiconductor device) according to a second embodiment of the present invention.

FIG. 9 is a sectional view of a vertical GaN-based FET 10 according to a second embodiment of the present invention. In this semiconductor device 10, an extended electrode is formed on the p⁺-type GaN supplementary layer and the extended electrode is electrically connected to the source electrode. That is, the extended electrode 11/p⁺-type GaN supplementary layer 7 corresponds to an electric connection structure for fixing the electric potential of the p-type GaN barrier layer 6 at an electric potential of the source electrode S. The thickness and impurity concentration of each layer in the GaN-based stacked layer 15 are the same as in the first embodiment.

In the semiconductor device 10 according to this embodiment, the above effects (a1) and (a2) can be produced due to the presence of the extended electrode 11/p⁺-type GaN supplementary layer 7. Furthermore, holes generated under the application of reverse bias voltage at the pn junction between the p-type GaN barrier layer 6 and the n⁻-type GaN drift layer 4 can be absorbed through the extended electrode 11. As a result, the degradation of breakdown voltage characteristics caused when holes are left can be prevented and thus good breakdown voltage characteristics can be stably provided.

Figure 10:
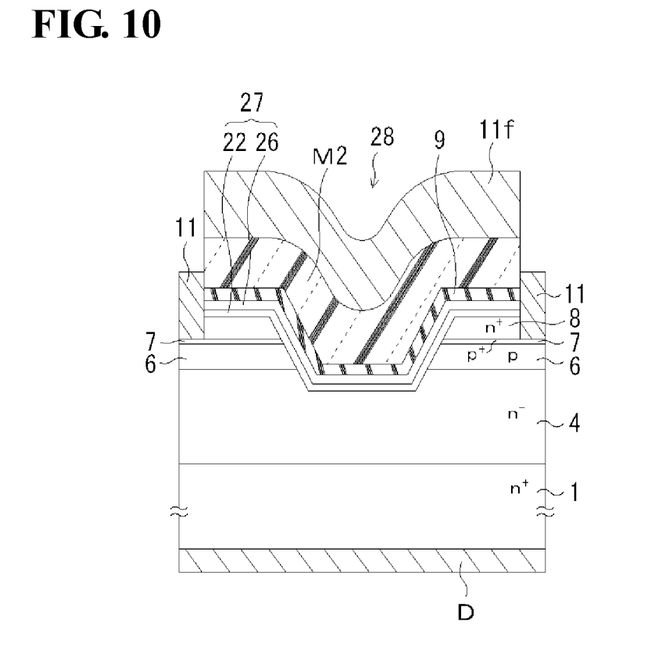
FIG. 10 is a diagram showing the state in which an extended electrode has been formed in a method for producing the semiconductor device in FIG. 9.
Figure 11:
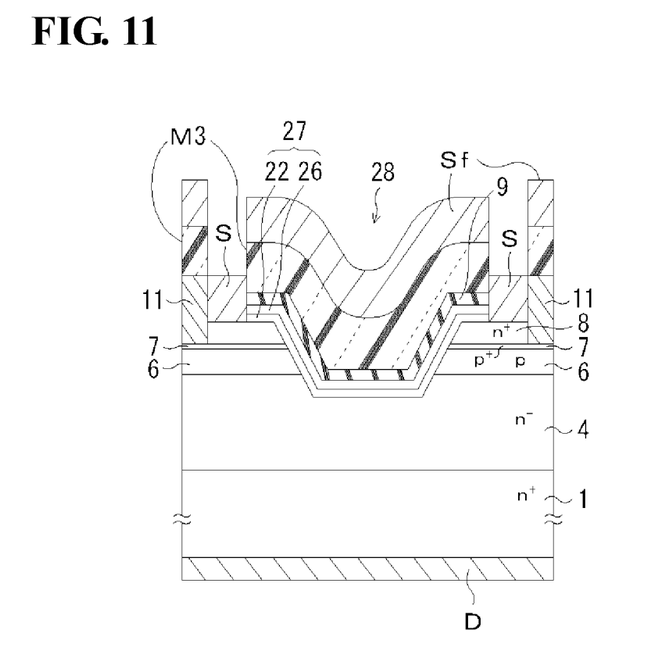
FIG. 11 is a diagram showing the state in which a source electrode has been formed, the state being brought after the state shown in FIG. 10.

Regarding the production method, most of the processes in the method described in the first embodiment can be employed. However, some of the processes need to be changed or additional processes are required to form the extended electrode 11. The changes are exemplified in FIGS. 10 and 11. Since a variety of methods can be employed, the production is not necessarily conducted as shown in the drawings. For example, as shown in FIG. 10, a resist pattern M2 is formed and a region of the n⁺-type GaN source layer 8 near or directly below the source electrode is partly removed to expose the p⁺-type GaN supplementary layer 7. The hole formed by the removal is filled with a conductive material using the resist pattern M2 as a mask to form an extended electrode 11. Herein, a metal layer 11f deposited on the resist pattern M2 during the formation of the extended electrode 11 is subjected to lift-off when the resist pattern M2 is removed. Subsequently, as shown in FIG. 11, a resist pattern M3 is formed and a source electrode S is formed using the resist pattern M3 as a mask so as to be connected to the extended electrode 11. A metal layer Sf deposited on the resist pattern M3 during the formation of the source electrode is subjected to lift-off when the resist pattern M3 is removed.

The extended electrode 11 may be formed of, for example, Ni/Au so as to be in ohmic contact with the p⁺-type GaN supplementary layer 7. The extended electrode and the source electrode need to be disposed so as to be electrically connected to each other. The source electrode S may be formed of, for example, Ti/Al/Ti/Au in consideration of the ohmic contact with the n+-type GaN source layer 8. As described in a third embodiment below, if good ohmic characteristics are achieved by using the same material for the extended electrode and source electrode, the extended electrode and source electrode may be formed of the same material.

The extended electrode 11 may be formed of a semiconductor containing an impurity in a high concentration.

By combining the source electrode S and extended electrode 11 with the p+-type GaN supplementary layer 7, the electric potential of the p-type GaN barrier layer can be fixed at a source potential with a low contact resistance.

Figure 12:
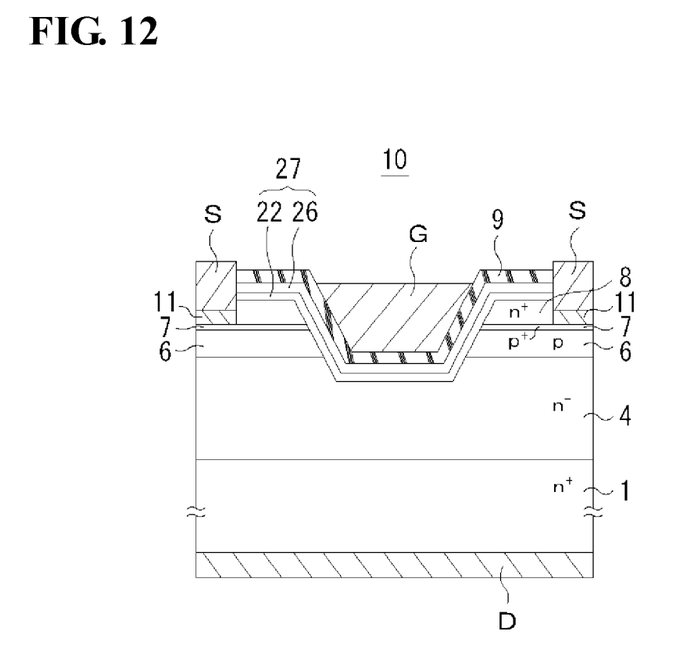
FIG. 12 is a diagram showing a vertical GaN-based FET having a structure in which the extended electrode of the semiconductor device shown in FIG. 9 is disposed directly below the source electrode.

Although the configuration of the extended electrode 11 shown in FIG. 9 is not significantly changed, a combination of extended electrode 11/source electrode S in which the source electrode S is successively formed on the extended electrode 11 as shown in FIG. 12 may be employed. In this case, the source electrode S is in (ohmic) contact with the n'GaN source layer 8 and the two-dimensional electron gas layer only at its side surface.

<Modification of Semiconductor Device in FIG. 9>

Figure 13:
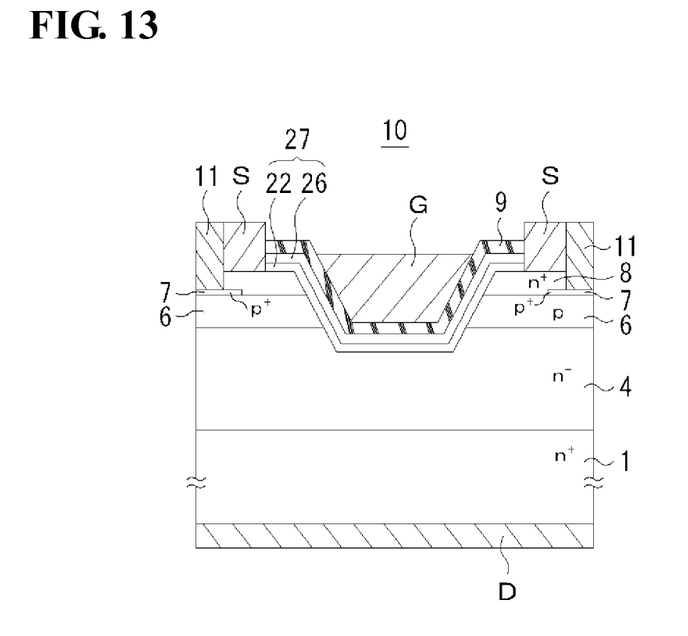
FIG. 13 is a sectional view of a semiconductor device that belongs to the second embodiment of the present invention, which is a modification of the semiconductor device in FIG. 9.

FIG. 13 is a diagram showing another semiconductor device 10 according to the second embodiment of the present invention, which is a modification of the semiconductor device in FIG. 9. In the semiconductor device in FIG. 9, the p+-type GaN supplementary layer 7 is present in the entire region other than the opening 28. However, in the modification shown in FIG. 13, the p+-type GaN supplementary layer 7 is disposed away from the opening 28. Even if the p+-type GaN supplementary layer 7 is partially disposed, the extended electrode 11 conductively connects the p+-type GaN supplementary layer 7 and the source electrode S to each other and thus the electric potential of the p-type GaN barrier layer 6 is fixed at a source potential (ground potential) with a low contact resistance.

Figure 14:
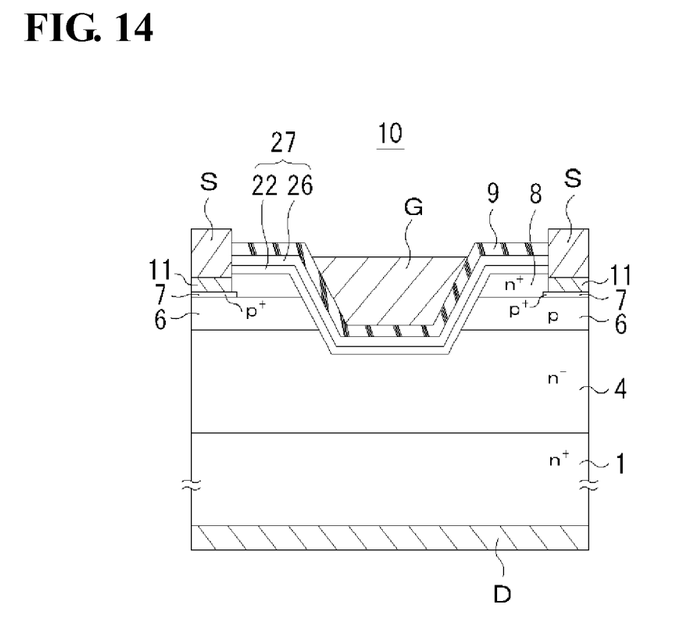
FIG. 14 is a diagram showing a vertical GaN-based FET having a structure in which the extended electrode of the semiconductor device shown in FIG. 13 is disposed directly below the source electrode.

Although the configuration of the extended electrode 11 shown in FIG. 13 is not significantly changed, a combination of extended electrode 11/source electrode S in which, as shown in FIG. 14, the source electrode S is successively formed on the extended electrode 11 while the p+-type GaN supplementary layer 7 is present in a limited region may also be employed. In this case, the source electrode S is in (ohmic) contact with the n+ GaN source layer 8 only at its side surface.

As a result, the above effects (a1) and (a2) can be produced as in the semiconductor device in FIG. 9. Furthermore, holes generated from a depletion layer of the pn junction between the p-type GaN barrier layer 6 and the n⁻-type GaN drift layer 4 can also be absorbed. Thus, the degradation of breakdown voltage characteristics caused when holes are left can be prevented.

Since the p+-type GaN supplementary layer 7 is disposed away from the opening 28, there is no possibility that an acceptor or a p-type impurity moves into the electron drift layer 22 and thus the advantages such as low on-resistance can be sufficiently utilized. A p-type impurity such as Mg moves relatively easily. In the structure in which the end face of the p+-type GaN supplementary layer 7 is exposed to the opening 28, the p-type impurity enters the electron drift layer 22 and may hinder the movement of electrons, though the probability of this happening is low compared with the case where the acceptor concentration of the p-type GaN barrier layer 6 is increased. In contrast, according to this modification, the movement of the p-type impurity into the electron drift layer 22 can be prevented with certainty.

The production can be performed by combining the production process in the modification according to the first embodiment (the semiconductor device shown in FIG. 8) with the production process of the semiconductor device shown in FIG. 9.

(Third Embodiment)

Figure 15:
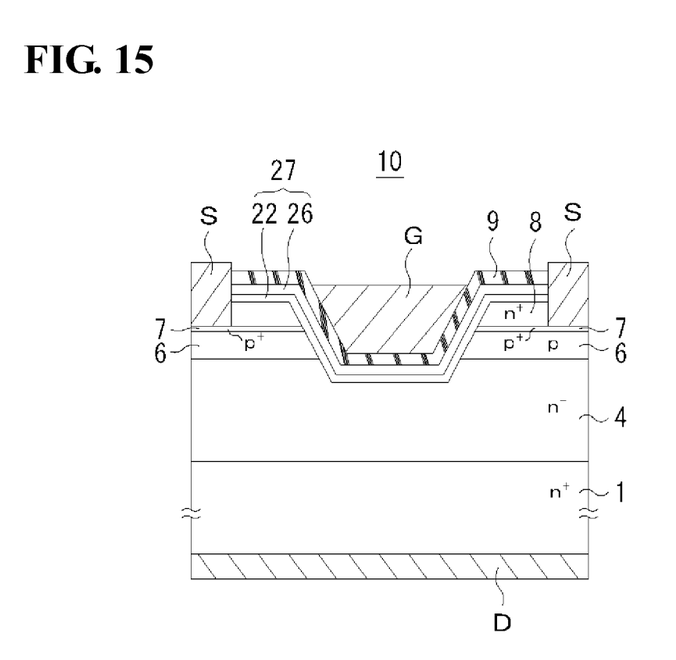
FIG. 15 is a sectional view showing a vertical GaN-based FET (semiconductor device) according to a third embodiment of the present invention.

FIG. 15 is a sectional view of a vertical GaN-based FET 10 according to the third embodiment of the present invention. In this semiconductor device 10, the source electrode S extends straight downwards and the extended electrode 11 that is conductively connected to the p+-type GaN supplementary layer 7 is formed of the same electrode material with the same cross section. This embodiment is based on the precondition that a low contact resistance lower than or equal to a certain level is satisfied for both the p+-type GaN supplementary layer 7 and n+-type GaN source layer 8 using the same electrode material. When importance is attached to low on-resistance, priority is given to a low contact resistance between the extended electrode 11 and the n+-type GaN source layer 8. However, whether the precondition is satisfied or not is dependent on the specifications required for the semiconductor device. In accordance with the specifications, there may be a case where the source electrode S and the extended electrode 11 cannot be formed using the same material.

As shown in FIG. 15, by forming the source electrode S and the extended electrode 11 using the same material, the structure of the semiconductor device 10 is simplified and the production process is also simplified.

Also in this case, the source electrode S is in (ohmic) contact with the n+-type GaN source layer 8 and the two-dimensional electron gas layer only at its side surface.

<Modification of Semiconductor Device in FIG. 15>

Figure 16:
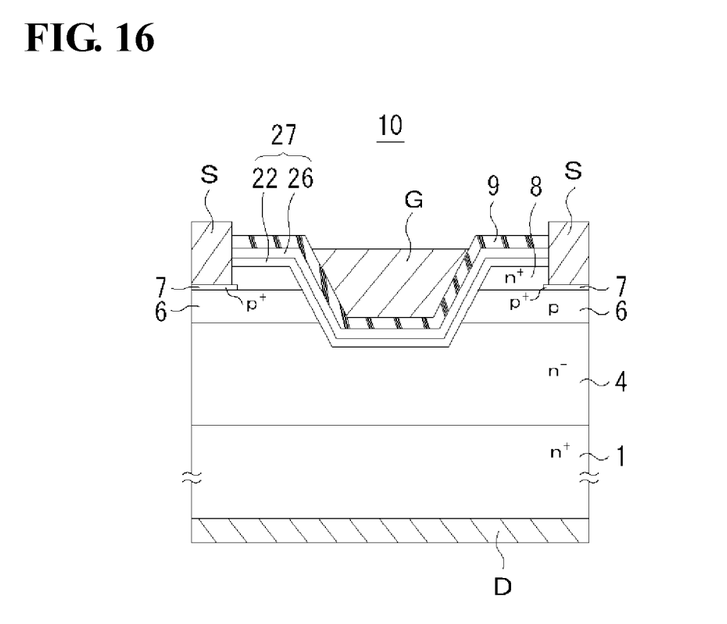
FIG. 16 is a sectional view of a semiconductor device that belongs to the third embodiment of the present invention, which is a modification of the semiconductor device in FIG. 15.

FIG. 16 is a diagram showing another semiconductor device 10 according to the third embodiment of the present invention, which is a modification of the semiconductor device in FIG. 15. In the semiconductor device in FIG. 15, the p+-type GaN supplementary layer 7 is present in the entire region other than the opening 28. However, in the modification shown in FIG. 16, the p+-type GaN supplementary layer 7 is disposed away from the opening 28. Even if the p+-type GaN supplementary layer 7 is partially disposed, the extended electrode 11 conductively connects the p+-type GaN supplementary layer 7 and the source electrode S to each other and thus the electric potential of the p-type GaN barrier layer 6 is fixed at a source potential (ground potential) with a low contact resistance.

The structures disclosed in the above embodiments of the present invention are mere examples and the scope of the present invention is not limited to these embodiments. The scope of the present invention is defined by the appended claims, and all changes that fall within the scope of the claims and the equivalence thereof are therefore embraced by the claims.

INDUSTRIAL APPLICABILITY

According to the semiconductor device or the like of the present invention, in a vertical GaN-based semiconductor device, the pinch-off characteristics and breakdown voltage characteristics can be improved by fixing the electric potential of a p-type barrier layer with certainty. Furthermore, holes generated under the application of reverse bias at a pn junction between a p-type GaN barrier layer and an n⁻-type GaN drift layer can be absorbed or annihilated.

REFERENCE SIGNS LIST

1 GaN substrate
4 n⁻-type GaN drift layer 6 p-type GaN barrier layer
7 p⁺-type GaN supplementary layer
8 n⁺-type GaN source layer
9 insulating layer
10 semiconductor device (vertical GaN-based FET)
11 extended electrode
11f metal layer of extended electrode to be subjected to lift-off
12 gate wiring line
13 gate pad
15 GaN-based stacked layer
22 GaN electron drift layer
26 AlGaN electron source layer
27 regrown layer
28 opening
S source electrode
Sf metal layer of source electrode to be subjected to lift-off
G gate electrode
D drain electrode
M1, M2, M3 resist pattern

The invention claimed is:

1. A vertical semiconductor device including a GaN-based stacked layer having an opening, the semiconductor device comprising:
a regrown layer including a channel located so as to cover a wall surface of the opening;
a p-type GaN-based semiconductor layer having an end face covered with the regrown layer at the wall surface of the opening;
an n⁺-type GaN-based semiconductor layer serving as a top layer of the GaN-based stacked layer;
a p⁺-type GaN-based supplementary layer containing a p-type impurity in a concentration higher than that of the p-type GaN-based semiconductor layer, the p⁺-type GaN-based supplementary layer being located between the p-type GaN-based semiconductor layer and the n⁺-type GaN-based semiconductor layer;
a gate electrode located on the regrown layer in the opening; and
a source electrode located on the GaN-based stacked layer around the opening so as to be in contact with the regrown layer and the n⁺-type GaN-based semiconductor layer,
wherein the regrown layer includes an electron drift layer and an electron source layer and the channel is formed of two-dimensional electron gas generated in the electron drift layer at a position near an interface between the electron drift layer and the electron source layer, and
the p⁺-type GaN-based supplementary layer is included in a structure that electrically connects the p-type GaN-based semiconductor layer and the source electrode to each other in order to fix an electric potential of the p-type GaN-based semiconductor layer at an electric potential of the source electrode, and
the n⁺-type GaN-based semiconductor layer and the p⁺-type GaN-based supplementary layer form a tunnel junction, and the source electrode and the p-type GaN-based semiconductor layer are electrically connected to each other through the tunnel junction.

2. The semiconductor device according to claim 1, wherein the p⁺-type GaN-based supplementary layer has a p-type impurity concentration of $5 \times 10^{18}$ cm$^{-3}$ or more and $5 \times 10^{20}$ cm$^{-3}$ or less and the n⁺-type GaN-based semiconductor layer has a donor concentration of $1 \times 10^{18}$ cm$^{-3}$ or more and $5 \times 10^{20}$ cm$^{-3}$ or less.

3. The semiconductor device according to claim 1, further comprising an extended electrode conductively connected to the p⁺-type GaN-based supplementary layer, wherein the extended electrode is electrically connected to the source electrode.

4. The semiconductor device according to claim 3, wherein the source electrode extends so as to also serve as the extended electrode.

5. The semiconductor device according to claim 1, wherein the thickness of the p⁺-type GaN-based supplementary layer is one fifth or less the thickness of the p-type GaN-based semiconductor layer.

6. The semiconductor device according to claim 1, wherein the p⁺-type GaN-based supplementary layer has a thickness of 5 nm or more and 100 nm or less.

7. The semiconductor device according to claim 1, wherein the p⁺-type GaN-based supplementary layer is disposed away from the wall surface of the opening.

8. The semiconductor device according to claim 1, wherein an insulating layer is formed on the regrown layer and below the gate electrode.

* * * * *